(12) United States Patent
Scanlon et al.

(10) Patent No.: US 10,615,595 B2
(45) Date of Patent: Apr. 7, 2020

(54) CHIP INCLUDING OVER-VOLTAGE AND SURGE PROTECTION

(71) Applicant: Analog Devices Global, Hamilton (BM)

(72) Inventors: James Scanlon, Raheen (IE); Brian Anthony Moane, Raheen (IE); John Twomey, Fountainstown (IE)

(73) Assignee: Analog Devices Global, Hamilton (BM)

( * ) Notice: Subject to any disclaimer, the term of this patent is extended or adjusted under 35 U.S.C. 154(b) by 387 days.

(21) Appl. No.: 15/163,838

(22) Filed: May 25, 2016

(65) Prior Publication Data
US 2017/0346276 A1 Nov. 30, 2017

(51) Int. Cl.
*H02H 9/04* (2006.01)
*H01L 23/60* (2006.01)

(52) U.S. Cl.
CPC ............. *H02H 9/046* (2013.01); *H01L 23/60* (2013.01); *H01L 2224/04042* (2013.01); *H01L 2224/32245* (2013.01); *H01L 2224/48247* (2013.01); *H01L 2224/73265* (2013.01); *H01L 2924/15311* (2013.01)

(58) Field of Classification Search
CPC ...... H02H 9/042; H02H 9/046; H02H 1/0007; H02H 1/0061
USPC .......................................................... 361/56
See application file for complete search history.

(56) References Cited

U.S. PATENT DOCUMENTS

| | | | | |
|---|---|---|---|---|
| 4,901,183 A * | 2/1990 | Lee | ........................ | H02H 9/04 |
| | | | | 361/56 |
| 5,347,185 A * | 9/1994 | Tailliet | ............... | H01L 27/0251 |
| | | | | 327/326 |
| 5,701,024 A * | 12/1997 | Watt | ..................... | H01L 27/027 |
| | | | | 257/360 |
| 6,040,968 A * | 3/2000 | Duvvury | ............ | H01L 27/0248 |
| | | | | 361/56 |
| 6,125,021 A * | 9/2000 | Duvvury | ............ | H01L 27/0266 |
| | | | | 361/56 |
| 6,353,521 B1 * | 3/2002 | Gans et al. | ......... | H01L 27/0251 |
| | | | | 361/56 |
| 6,377,434 B1 * | 4/2002 | Martineau | ............... | H01C 1/16 |
| | | | | 361/106 |
| 6,459,553 B1 * | 10/2002 | Drapkin et al. | .... | H01L 27/0266 |
| | | | | 361/56 |
| 7,589,945 B2 * | 9/2009 | Miller | .................... | H02H 9/046 |
| | | | | 361/56 |
| 7,593,204 B1 * | 9/2009 | Iversen | .................. | H02H 9/046 |
| | | | | 361/56 |

(Continued)

OTHER PUBLICATIONS

"ESD and Surge Circuit Protection" Littelfuse. 2011 Littelfuse, Inc. (No Month.).*

(Continued)

*Primary Examiner* — Scott Bauer
(74) *Attorney, Agent, or Firm* — Wolf, Greenfield & Sacks, P.C.

(57) ABSTRACT

An integrated circuit is provided in which a surge protector, protecting against modest over-voltage events which may contain a lot of energy, and an electrostatic discharge (ESD) protector, protecting against high voltage events that may contain only a little energy, are provided within the integrated circuit package. The two types of protectors may protect against different types of electrical events.

20 Claims, 10 Drawing Sheets

(56) References Cited

U.S. PATENT DOCUMENTS

| | | | | |
|---|---|---|---|---|
| 7,791,851 | B1* | 9/2010 | Luquette et al. | ... H01L 27/0266 361/56 |
| 7,948,725 | B2* | 5/2011 | Kiuchi | H01L 23/552 361/56 |
| 8,816,389 | B2 | 8/2014 | Coyne | |
| 2003/0011026 | A1* | 1/2003 | Colby | H01R 13/6485 257/322 |
| 2003/0142449 | A1* | 7/2003 | Iwata | H02H 1/0015 361/58 |
| 2005/0063129 | A1* | 3/2005 | Kato | H02H 9/046 361/212 |
| 2005/0122644 | A1* | 6/2005 | Ma | H01L 27/0255 361/56 |
| 2005/0271147 | A1* | 12/2005 | Dupuis | H01L 23/66 375/258 |
| 2007/0058308 | A1* | 3/2007 | Thijs | H03F 1/223 361/56 |
| 2009/0207538 | A1* | 8/2009 | Crawley | H04L 12/10 361/56 |
| 2010/0039740 | A1* | 2/2010 | Jalilizeinali | H01L 23/60 361/56 |
| 2011/0010144 | A1 | 1/2011 | Fox et al. | |
| 2012/0074846 | A1* | 3/2012 | Marreiro | H05B 33/0866 315/122 |
| 2013/0119949 | A1* | 5/2013 | Albertson | H01G 9/00 323/209 |
| 2014/0071566 | A1* | 3/2014 | Parthasarathy | H01L 23/62 361/56 |
| 2014/0118877 | A1* | 5/2014 | Viele | H02H 9/005 361/111 |
| 2014/0146426 | A1* | 5/2014 | Murakami | H03K 19/00315 361/56 |
| 2016/0013638 | A1* | 1/2016 | Glas | H01L 27/0255 361/56 |

OTHER PUBLICATIONS

[No Author Listed], ACTP250J1BJ AC Transient Protector. ACTP250J1BJ Bidirectional Thyristor Overvoltage Protectors. Bourns. Product Datasheet. Jun. 8, 2011. 6 pages.

[No Author Listed], TISP1xxxF3 Overvoltage Protector Series. TISP1072F3,TISP1082F3 Dual Forward-Conducting Unidirectional Thyristor Overvoltage Protectors. Bourns. Product Datasheet. Sep. 2008. 12 pages.

[No Author Listed], TISP30xxF3 (LV) Overvoltage Protector Series. TISP3072F3, TISP3082F3 Low-Voltage Dual Bidirectional Thyristor Overvoltage Protectors. Bourns. Product Datasheet. Sep. 2008. 12 pages.

[No Author Listed], TISP40xxH1BJ VLV Overvoltage Protector Series. TISP4015H1BJ, TISP4025H1BJ, TISP4030H1BJ, TISP4040H1BJ Very Low Voltage Bidirectional Thyristor Overvoltage Protectors. Bourns. Product Datasheet. Oct. 2015. 9 pages.

[No Author Listed], TISP4G024L1W G.Fast VDSL Protector. Bourns. Product Datasheet. Oct. 2015. 10 pages.

[No Author Listed], TISP4xxxJ3BJ Overvoltage Protector Series. TISP4070J3BJ thru TISP4395J3BJ Bidirectional Thyristor Overvoltage Protectors. Bourns. Product Datasheet. Nov. 2013. 7 pages.

[No Author Listed], TISP4xxxM3AJ Overvoltage Protector Series. TISP4070M3AJ thru TISP4115M3AJ, TISP4125M3AJ thru TISP4220M3AJ, TISP4240M3AJ thru TISP4395M3AJ Bidirectional Thyristor Overvoltage Protectors. Bourns. Product Datasheet. Jan. 2007. 12 pages.

[No Author Listed], TISP4xxxT3BJ Overvoltage Protector Series. TISP4290T3BJ, TISP4350T3BJ, TISP4400T3BJ Bidirectional Thyristor Overvoltage Protectors. Bourns. Product Datasheet. May 2008. 6 pages.

[No Author Listed], TISP5xxxH3BJ Overvoltage Protector Series. TISP5070H3BJ thru TISP5190H3BJ Forward-Conducting Unidirectional Thyristor Overvoltage Protectors. Bourns. Product Datasheet. Jan. 2007. 11 pages.

[No Author Listed], TISP61089 Gated Protector Series. TISP61089D, TISP61089SD, TISP61089AD, TISP61089ASD Dual Forward-Conducting P-Gate Thyristors Programmable Overvoltage Protectors. Bourns. Product Datasheet. Jul. 2008. 8 pages.

[No Author Listed], TISP61089QB SLIC Overvoltage Protector. TISP61089QB Programmable Overvoltage Protector Quad Forward-Conducting P-Gate Thyristor. Bourns. Product Datasheet. May 2012. 5 pages.

[No Author Listed], TISP70xxL1 (VLV) OvervoltageProtectors. TISP7015L1, TISP7038L1 Triple Element Thyristor Overvoltage Protectors. Bourns. Product Datasheet. Jul. 2008. 8 pages.

[No Author Listed], TISP820xHDM Overvoltage Protectors. TISP8200HDM Buffered P-Gate SCR Dual TISP8201HDM Buffered N-Gate SCR Dual Complementary Buffered-Gate SCRS for Dual Polarity SLIC Overvoltage Protection. Bourns. Product Datasheet. May 2007. 7 pages.

[No Author Listed], TISP8250D Overvoltage and Overcurrent Protector. TISP8250D Unidirectional P-Gate Thyristor Overvoltage and Overcurrent Protector. Bourns. Product Datasheet. Jul. 2008. 4 pages.

[No Author Listed], TISP83121D Unidirectional P & N-Gate Protector. TISP83121D Dual-Gate Unidirectional Overvoltage Protector. Bourns. Product Datasheet. Jul. 2008. 5 pages.

[No Author Listed], TISP9110LDM Overvoltage Protector. TISP9110LDM Integrated Complementary Buffered-Gate SCRS for Dual Polarity SLIC Overvoltage Protection. Bourns. Product Datasheet. Jan. 2007. 5 pages.

Ghiorse, ESD/Latch-Up Considerations with *i*Coupler Isolation Products. Analog Devices. AN-793 Application Note. Rev A. 2014. 8 pages.

\* cited by examiner

CHIP INCLUDING OVER-VOLTAGE AND SURGE PROTECTION

FIELD

The present disclosure relates to a chip (an integrated circuit or system in a circuit package) that includes over-voltage protection. This also includes fault protection where failure of a component may expose the chip to over-voltages or a supply for the chip fails such that signals are supplied to it which exceed the voltage range defined by the supply rails to the chip.

BACKGROUND

It is known that integrated circuits can be damaged by transient over-voltage conditions which can stress transistors which have, for example, been designed with a given breakdown voltage, for example because the majority of the transistors have been formed using a "standard" fabrication process offered by a fabricator (and often defined by voltage) where the majority of the transistors have a standard dimension to give a desired trade-off between speed, packing density and voltage handling. To address this risk of over-voltage damage or damage from electrostatic discharge (ESD), it is known that protection circuits can be provided. In early integrated circuits these protection devices were often implemented as diodes between a pin and a supply rail. However these protection circuits are crude and cannot be used in circuits such as line drivers or bus drivers where being able to withstand a voltage in excess of the supply rails of a device without opening an uncontrolled current path is a system requirement.

In general the integrated circuit manufacturer selects the transistor size/fabrication process based on the design requirements of the functional circuit rather than prioritizing the requirements of any embedded over-voltage protection system. This makes sense as transistors able to withstand high voltages and currents which might occur in an over-voltage event tend to be physically big which reduces their speed due to the combined effect of parasitic capacitance and carrier transit time. Also such devices consume more area on a wafer, so ultimately high voltage and high current handling gives rise to more expensive and slower transistors.

More recently ESD or other over-voltage event protection circuits have been implemented using transistors within an integrated circuit. However, the transistor parameters and fabrication processes used in these integrated over-voltage protection circuits have not typically been optimized for their over-voltage function. Instead, the performance characteristics of these over-voltage transistors have largely been dependent upon fabrication parameters chosen to optimize other transistors that carry out the primary function of the circuit to be protected. Therefore, it has mainly been a matter of luck whether the fabrication parameters chosen to optimize majority devices are suitable for use in the accompanying over-voltage protection circuit. While it is possible to separately optimize an over-voltage protection circuit using additional processing steps, those additional processing steps carry increased costs. A typical over-voltage event is an electrostatic discharge (ESD) event.

Additionally devices may have to withstand "surge" events. These also manifest themselves as over-voltage events but can be quite different to ESD events. An ESD event can be generalized as being an event of very short duration, with a very large excess voltage but little energy. Such an event may occur as a result of a person becoming electrostatically charged when walking over a nylon carpet. A surge event is slower (for example it may result from an inductive load being switched) and typically has a much lower peak voltage but may involve a large amount of energy.

SUMMARY

In accordance with this disclosure an over-voltage protection arrangement is provided as part of an integrated circuit, and where the interaction between first and second protection devices is adjusted based on a first voltage threshold which must be exceeded before either of the first and second protection devices trigger and a second voltage threshold which must not be exceeded. The first protection device is adapted to protect against voltage surge events and/or electrical fast transient (EFT) events and the second protection device is adapted to protect against ESD events. The second protection device may protect against electrical fast transient events.

In one example embodiment an integrated circuit package containing a first semiconductor die carrying a functional circuit is provided. The functional circuit interacts, in use, with devices outside of the integrated circuit package by way of a plurality of connection nodes. At least a first electrical path between the functional circuit and at least one of the connection nodes includes a first electrical over-voltage protection arrangement. The first over-voltage protection arrangement comprises a first electrical over-voltage protection device having a first trigger voltage and a first response time, and a second electrical over-voltage protection device having a second trigger voltage and a second response time. The second over-voltage protection device and the first over-voltage protection device are connected to an associated connection node, and wherein the second trigger voltage is higher in magnitude than the first trigger voltage.

Electrical over-voltage events have been classified into several types. The International Electrotechnical Commission (IEC) defined standards relating to several forms of over voltage transients.

IEC61000-4-2 relates to electrostatic discharge events. IEC6000-4-2 includes a "Human body model" where charge transfer simulating an ESD event from a human body is defined. Such events are categorised by a test waveform having a first peak rising in 0.7 to 1 ns, with a second peak at 30 ns and a duration of only 60 ns. The energy is around several hundred micro-joules and direct contact test voltages are up to 8 kV for the most stringent test (class 4).

IEC 61000-4-4 relates to electrical fast transient (EFT) events which are typical of arcing of contacts in switches and relays. The IEC 61000-4-4 test standard identifies transient threats for power lines and data lines. Test signals are provided as high voltage spikes, provided in bursts of 15 ms repeated at 300 ms intervals. Each individual burst has a rise time of 5 ns and a duration of 50 ns. For data lines a repetition rate of 2 kHz to 5 kHz is allowed with threat levels of up to 2 kV and transient currents up to 40 A (assuming 50Ω local)

IEC 61000-4-5 relates to surge events. Such events may result from lightning strikes and loads being switched. Two surge waveforms are specified, one is an open circuit waveform often known as 1.2×50 µs waveform and the other waveform is a closed circuit waveform often known as the 8×20 µs waveform. Class 5 (the highest class within the 61000-4-5 standard) contemplates test voltages of up to 4 kV and transient currents of up to 95 A.

It can be seen the 61000-4-2 events are very short (nanoseconds) and contain very little energy. The 61000-4-4 events are longer in duration, but each individual pulse is still measured in 10's of nanoseconds, with more energy, whereas the 61000-4-5 events have a duration measured in microseconds, both in terms of rise time and duration, and contain much more energy.

As used herein, ESD events conform to the IEC 61000-4-2 standard, EFT events conform to the IEC 61000-4-4 standard as surge events conform to the IEC61000-4-5 standard.

It is thus possible to absolve the device user from having to match and balance the surge, EFT and ESD over-voltage protection requirements with the loading and operating voltage conditions within the integrated circuit.

BRIEF DESCRIPTION OF THE DRAWINGS

Embodiments of the present disclosure will now be described, by way of non-limiting example only, with reference to the accompanying drawings, in which.

DETAILED DESCRIPTION OF SOME EMBODIMENTS

Terms such as above, below, over, and so on as used herein refer to a semiconductor device orientated as shown in the figures and should be construed accordingly. It should also be appreciated that, because regions within a semiconductor device are defined by doping different parts of a semiconductor with differing impurities or differing concentrations of impurities, discrete physical boundaries between different regions may not actually exist in the completed device but instead regions may transition from one to another. Some boundaries as shown in the accompanying figures are of this type and are illustrated as abrupt structures merely for the assistance of the reader. The skilled artisan can readily determine with such gradients where to set boundaries for discrete functional diffusion regions in a semiconductor device.

As noted before, transistors have sometimes been used to provide over voltage protection, for example as electrostatic protection devices. However an integrated circuit may contain millions of transistors. The circuit designer wants to use as few process steps as possible in the fabrication of the integrated circuit since each additional masking and implanting step adds further cost. Also each step brings an increased error rate which reduces the yield of working devices formed on a wafer. Thus additional steps are preferably avoided. Given that the majority of transistors on a device will have a specific task, such as forming logic elements, then the transistor parameters are chosen so as to be appropriate for the majority task. Consequently the transistors that are formed are generally not suited for use in electrostatic discharge protection circuits or surge protection circuits, or give severely compromised performance.

The inventors realized that the tasks of providing ESD, EFT and surge protection for integrated circuits was costly and troublesome for users of such integrated circuits. Furthermore, as many of the ESD or other protection devices that are provided in integrated circuits are intended to be transparent to the end user, then the end user may provide additional and possibly partially redundant protection devices around an integrated circuit which add loading the circuit and ultimately may limit the maximum performance of such an integrated circuit and of a system containing such an integrated circuit.

Figure 1:
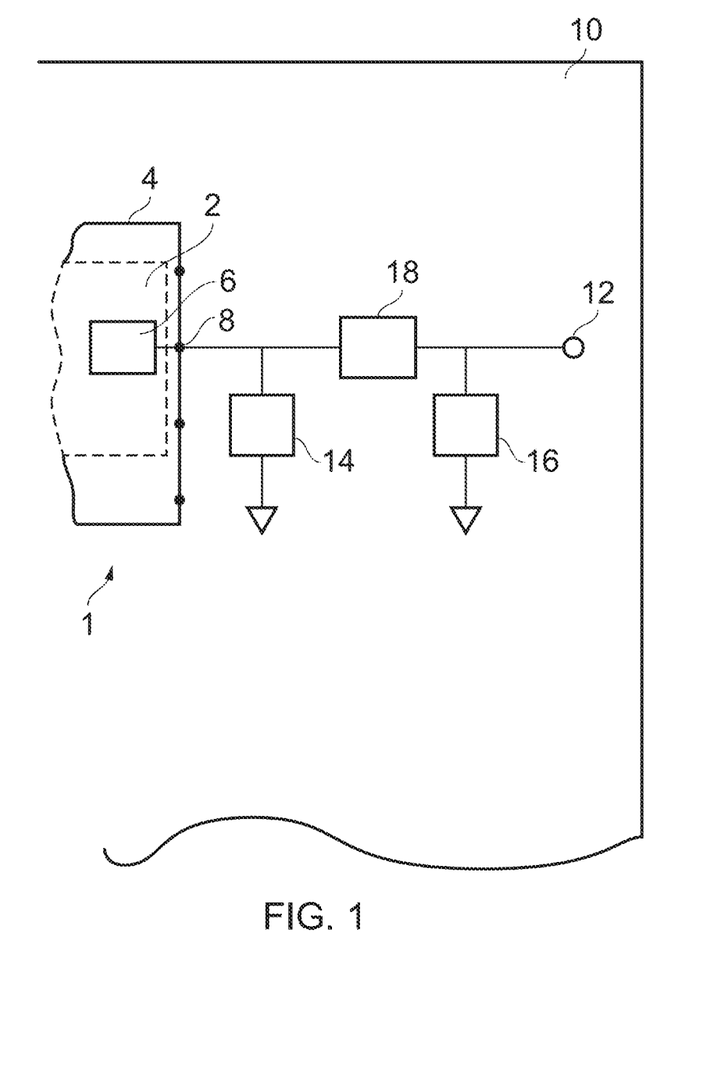
FIG. 1 schematically illustrates an integrated circuit on a printed circuit board, and where a pin of the integrated circuit is connected to an input/output pin of the circuit board by way of intervening components providing surge and ESD protection.

FIG. 1 diagrammatically illustrates an integrated circuit 1 comprising a semiconductor die 2 packaged within an integrated circuit package 4. The integrated circuit package 4 could be any type of package such as a through hole package, for example dual in-line packages (DIP), surface mount packages such as column grid array lead-less lead frame packages, land grid array and multichip module; chip carrier packages such as bump chip carriers, pin grid arrays, flat packages, small outline packages, chip scale packages and ball grid array packages.

A functional circuit 6 is provided on the die 2 and is connected to a terminal 8 of the Integrated circuit package 4 such that it can send and/or receive signals from outside of the package 4. The integrated circuit 1 may be mounted on a circuit board 10 that carries a connector 12 which, in use, may be connected to other circuit boards by way of a wire, which may include a local area network.

The manufacturer of the system on the circuit board 10 may not be able to guarantee that the wire/network will not present an electrical overstress event to the connector 12 and hence from the connector 12 to the integrated circuit 1. Therefore the manufacturer typically provides a protective network comprising a primary protection device 14, a secondary protection device 16 and a coordinating component 18 which the manufacturer of the system choses to tailor the combined response of the primary and secondary device. The coordinating component 18 is typically a resistor, but may also be a non-linear device. The primary protection device provides protection against surge events. It may also provide protection against EFT events. The secondary protection device provides protection against ESD events. It may also provide protection against EFT events. Furthermore the protection circuit may also provide protection against some fault modes. For example, if the node 12 is connected to a bus because the active circuit communicates over the bus, then other components connected to the bus may have fault modes where they apply an excess voltage to the bus.

Generally, integrated circuit manufactures include some form of ESD protection in their chips as it is prudent.

Figure 2:
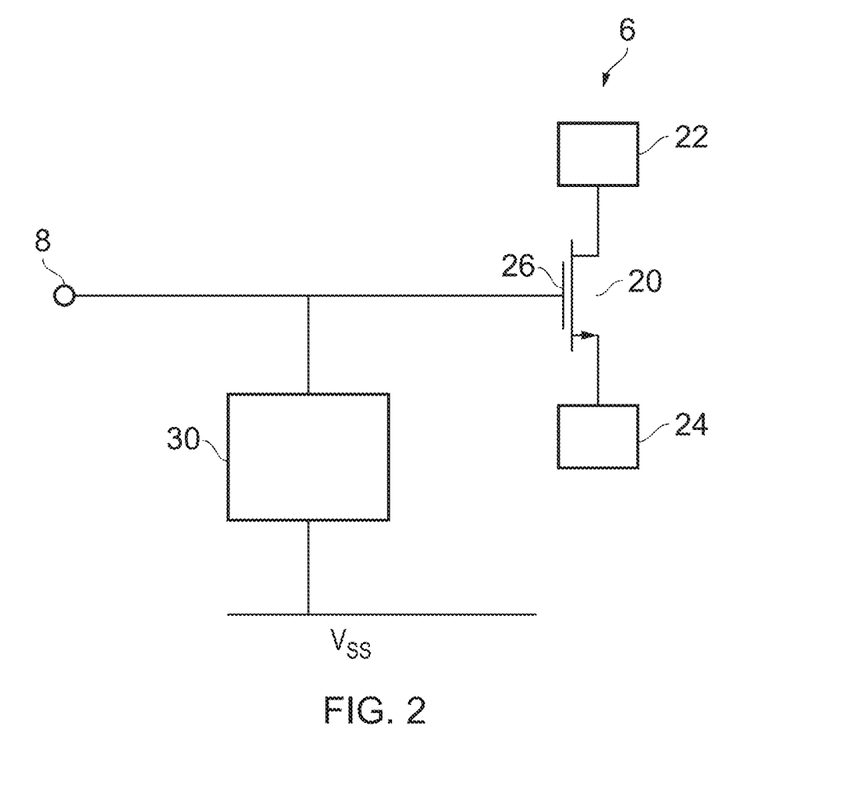
FIG. 2 schematically illustrates an input stage of the integrated circuit, the input stage including an electrostatic discharge protection device fabricated within the integrated circuit package.

FIG. 2 shows part of the functional circuit 6 of FIG. 1. The functional circuit has a device, in this instance an input transistor 20 whose drain and source are connected to circuit components 22 and 24, which may be any type of circuits with any function for the purpose of the present disclosure. A gate 26 of the transistor is connected to the terminal 8 of the integrated circuit 1. The transistor 20 is susceptible to permanent damage due to high voltages at the input terminal 8, for example electrostatic discharge if someone handling the integrated circuit 1 had become charged by walking over a nylon carpet.

In order to protect the transistor 20 from damage, an electrostatic protection device (or circuit) 30 is provided on the die 2 so as to limit the voltage excursions at the gate 26 of the transistor.

It is useful to consider the operation of an electrostatic discharge, ESD, protection device. Ideally, an electrostatic protection device should exhibit a controllable and selectable trigger voltage T. For input voltages having a magnitude less than the trigger voltage T, the device should be in a high-impedance (non-conducting) state. Once the trigger voltage magnitude has been exceeded the device should enter a low impedance state and start conducting.

The protection device may also offer "fold back" or "snap back" such that once it starts conducting, the voltage across the device reduces to a lower value. In this case, the device remains conducting, provided that the input voltage remains above a threshold magnitude, which may be called a "holding voltage".

Figure 3:
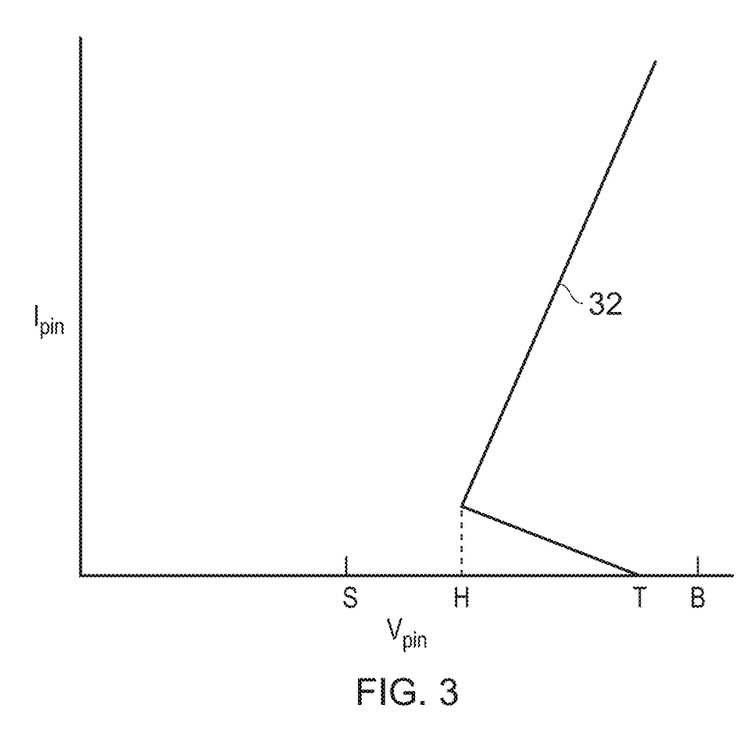
FIG. 3 illustrates a desirable current versus voltage operating characteristic of an electrostatic discharge protection device.

FIG. 3 illustrates an operating characteristic of an electrostatic protection device. It can be seen that the ESD protection device does not pass any current until a trigger voltage T has been reached. The trigger voltage is less than a breakdown voltage B for the device being protected. Once the trigger voltage has been reached the ESD protection device starts conducting, and the voltage across the device falls back to a holding voltage H. Although in an ideal device current flow could then increase without the voltage across the device increasing, due to resistance within the ESD protection device 30, the voltage increases slightly with increasing current in the region 32. If the holding voltage is not outside the supply rail voltage range, then once the ESD protection device has switched on, it will not switch off. Once the voltage across the device has decreased below a holding voltage, H, the ESD protection device can return to a high impedance state, effectively switching off.

Thus because the internal ESD protection device 30 is transparent to the user, and because its performance may not be fully described in the data sheet for an integrated circuit, the user may end up incurring additional cost to implement a protection network that is expensive in terms of additional components and board area, and may be partially unnecessary.

The inventors realized that a saving in cost and a functional improvement could be obtained if the chip manufacturer incorporated both ESD protection and EFT and/or surge protection components within the integrated circuit package. Not only would this save area, but the functionality of the surge, EFT and ESD protection could be improved as the chip manufacturer could adjust their individual responses to work in synergy.

Figure 4:
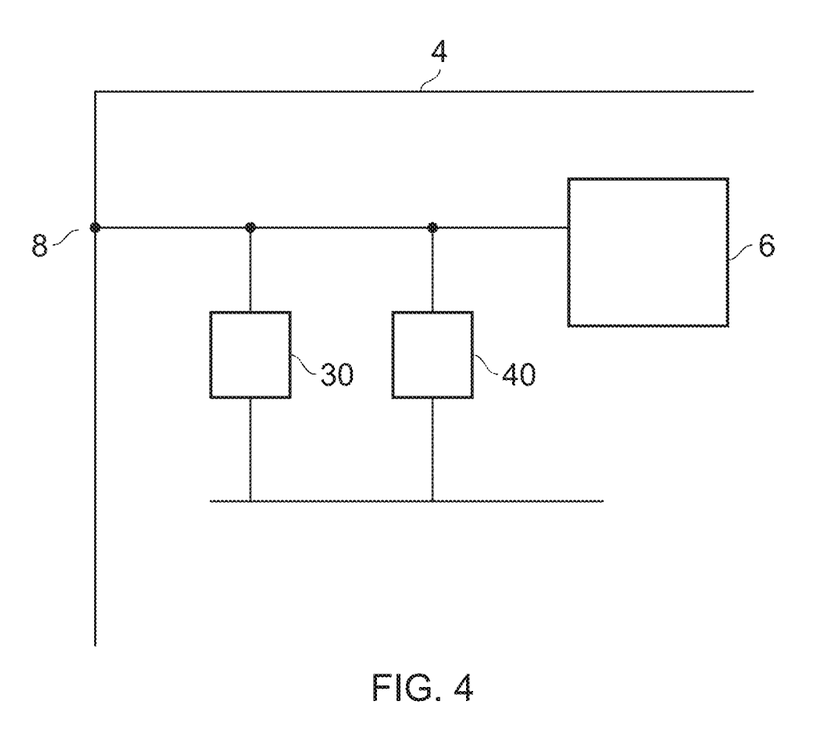
FIG. 4 shows part of the device constituting an embodiment of the present disclosure.

FIG. 4 schematically illustrates an embodiment of the present disclosure where a functional circuit 6 is connected to a pin 8 of an integrated circuit package 4, and there the integrated circuit package 4 further includes a primary protection device 30 and secondary protection device 40. With careful selection, the responses of the primary and secondary protection elements can be coordinated without the addition of the coordinating component 18 shown in FIG. 1.

Recalling that the transistors fabricated on the die are generally optimised for the task that the circuit is to perform and that the additional processing steps that are required to form high voltage devices and high current devices can incur significant additional costs, the inventors noted that it was cost effective to form one of the ESD protector and the surge protector on a different die and then package that additional die within the same integrated circuit package. Surge protectors are well established components that have been commercially available for several years. The surge protector may be a commercially available surge protector that can be bought as an unpackaged die. Such devices, for example as thyristor surge protectors are available in a variety of trigger voltages as set out at http://www.bourns.com/products/circuit-protection/thyristor-surge-protectors from Bournes Inc and Bournes Ltd. Similar components are available from other manufacturers such as "microsemi", "ST microelectronics" and "on semiconductor". These components tend to take up a large amount of silicon real-estate and from an economic perspective it is more cost effective to buy these products from manufacturers who have a bulk market for these products rather that fabricating them, especially as these devices will typically be fabricated using a different fabrication process to that which the manufacturer uses for their data processing, signal processing and other high speed/low voltage circuits.

Such surge protection components can be purchased with trigger voltages in a variety of voltages, for example around 60V, 70V, 80V and 90V. The surge protection devices may also provide some or all of the required EFT protection.

The ESD protection needs to be faster that the surge protection and also be tailored in its trigger voltage, so as to have a higher trigger voltage (larger magnitude) than the surge protector but still trigger with a margin of safety before potentially unsafe voltages are applied to the devices, such as bus drivers, logic gates, receivers and other input/output devices that may be provided within an integrated circuit. The ESD protection may, for example, be based on the circuit described in U.S. Pat. No. 8,816,389 (the content of which is incorporated by reference) or US 2011/0101444 which is also incorporated by reference but where, for the sake of completeness some its teaching is reproduced here such a device is also fast enough to provide some or all of the EFT protection.

Figure 5:
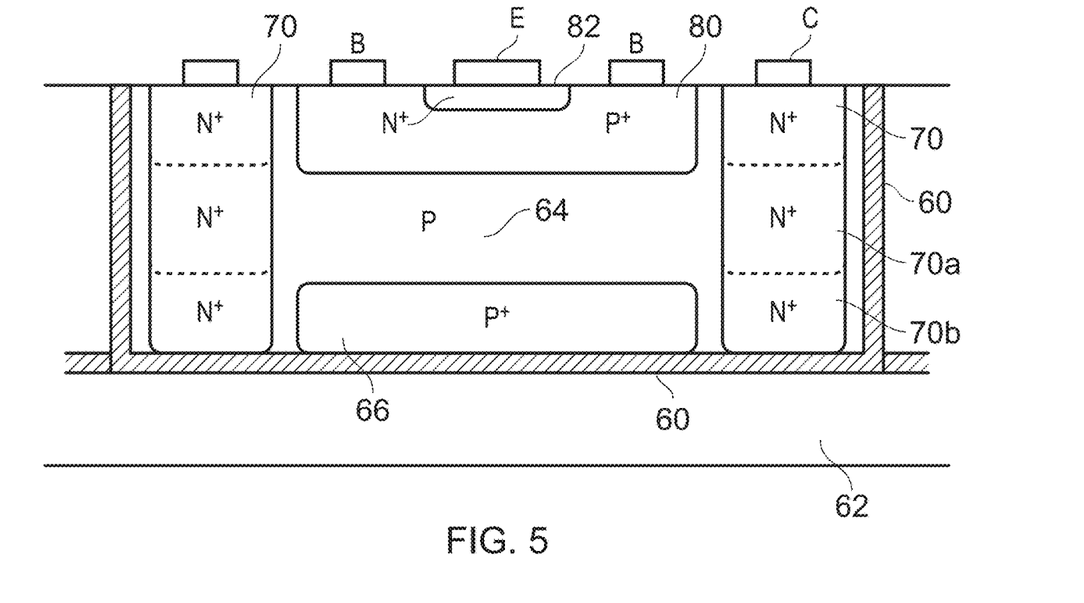
FIG. 5 shows the doping profile of an electrostatic protection device.

FIG. 5 schematically illustrates the layout of an ESD protection device in accordance with an embodiment of US2011/0101444. The device is illustrated as being fabricated inside a well of semiconductor delimited by insulating material. This may be advantageous as it provides enhanced device isolation (and the processes for providing such isolation are well known as silicon on insulator processes and offered by semiconductor fabricators as standard so do not need to be described here).

The device shown in FIG. 5 represents a single transistor within an integrated circuit, which may have millions of transistors formed thereon. The transistor is this example is formed in an insulated well defined by insulating walls 60 over a carrier wafer 62. A P type bulk material 64 is formed within the well, with a P+ region 66 optionally being formed at the base of the insulated well beneath base and emitter regions of the device. N type regions 70 encircle the base and emitter regions to form the collector of the transistor. A P type region 80, more heavily doped that the bulk material 64 forms a base region of the transistor and a heavily doped N type region 82 forms the emitter region of the transistor.

The fabrication inside a well of insulating material (as shown) may be advantageous for an ESD protection device as the magnitude and polarity of the ESD event may be unpredictable. Side walls 60 can be formed as dielectric-filled trenches, whereas the bottom of the well can be provided as silicon dioxide in a SOI structure.

The $P^+$ region 66 provided along the bottom of the device helps ensure that any vertical NPN transistor structure is prevented. The bulk P region provided between the base region 80 and the $P^+$ region 66 also inhibits vertical transistor formation. Additionally, as the transistor is deliberately fabricated as a horizontal structure, the collector regions 70 need only be provided in the vicinity of the surface. Alternatively, the $N^+$ region 70 can be extended, as illustrated by regions 70a and 70b.

Figure 6:
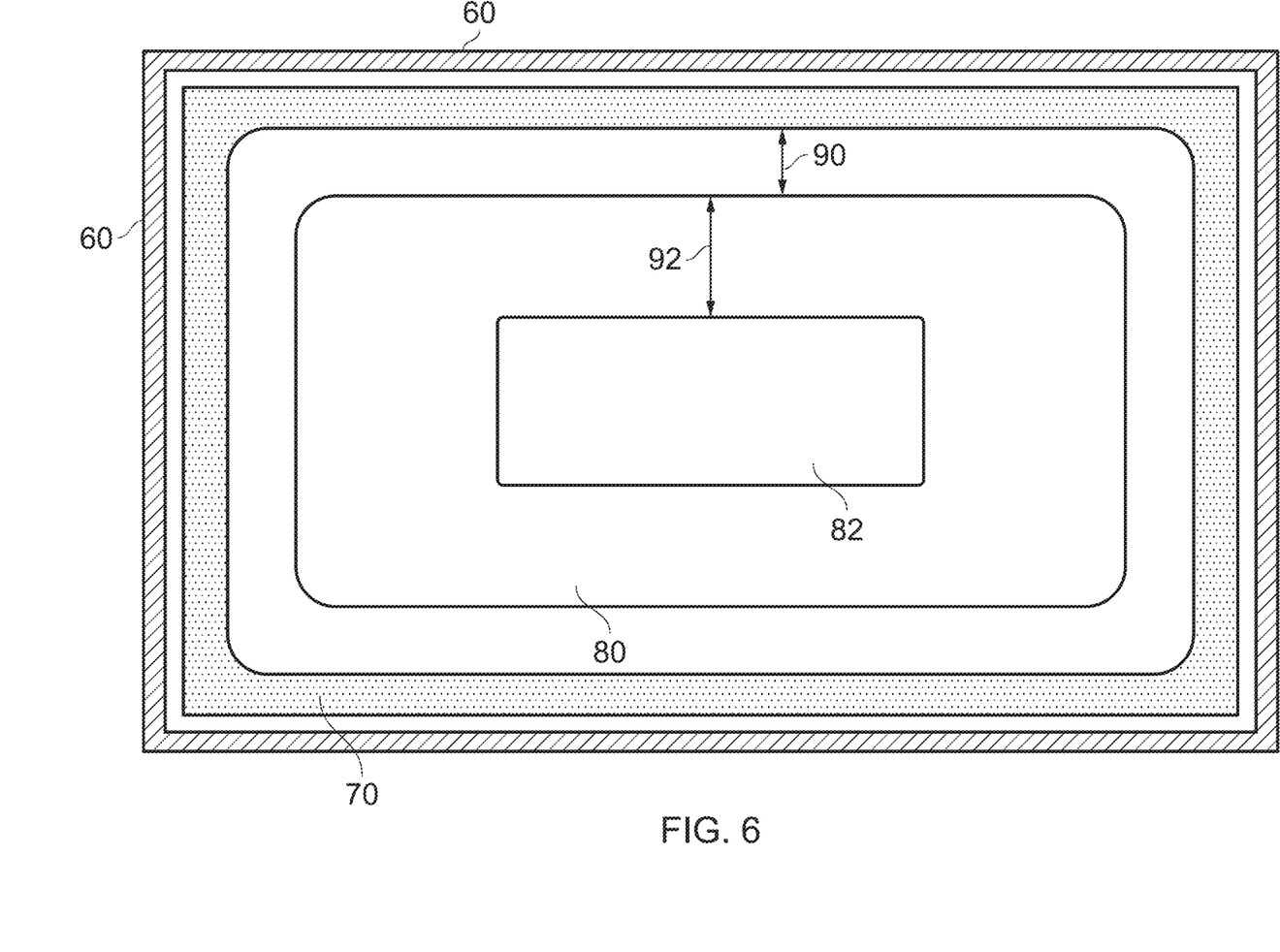
FIG. 6 is a plan view of the device of FIG. 5 which may be used in embodiments of this disclosure.

FIG. 6 is a plan view of the surface of the device shown in FIG. 5, and shows where the implantations for the collector region 70, base 80 and emitter 82 are located.

The base-collector separation 90 controls the trigger voltage of the ESD protection device. The distance 92, defining the width of the base 80, controls the holding voltage. Thus the device parameters are controlled by spatial features defined at the surface of the device. This means device characteristics can be accurately defined during design of the masks used to define the doping regions.

Similarly, the area and volume of the base 80 may also control the holding voltage. For example, the area may be defined at the surface by modifying the width and length of the base 80, depending upon the shape. The volume is defined by the area times depth of the doped region. Thus, generally, a horizontal dimension defined during doping steps can be modulated to affect that horizontal dimension as well as the area and volume of the doped region, such that each of these parameters can be said to control an operational threshold of an ESD device.

Figure 7:
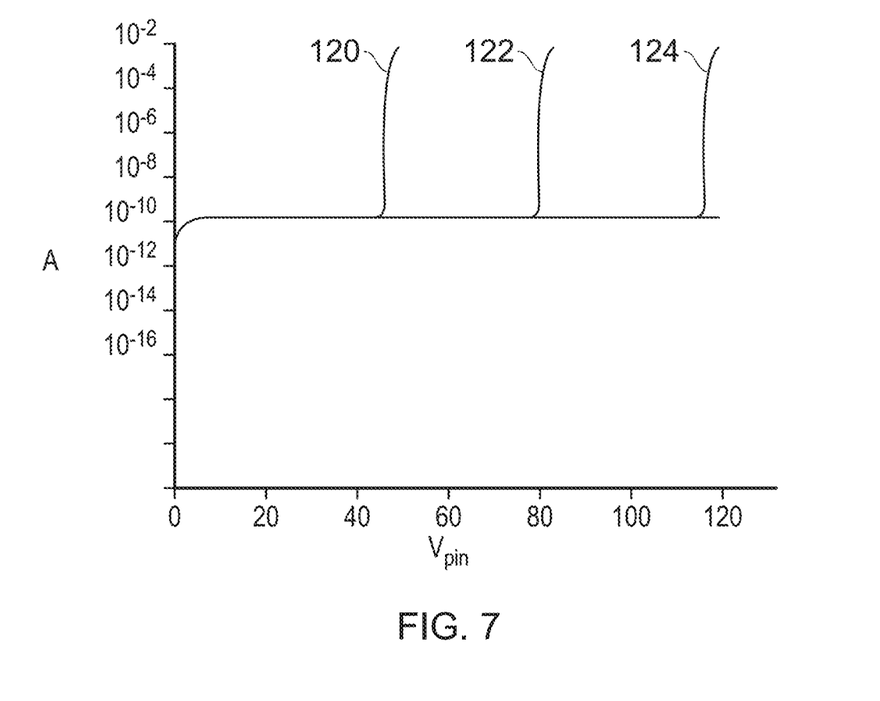
FIG. 7 is a graph of current flow versus pin voltage for a device under test, illustrating different trigger voltages for different collector-base separations in the ESD protection device of FIG. 5.

FIG. 7 shows test results for current flow versus voltage for a device under test, according to one embodiment. The input voltage at the terminal 8 (FIG. 4), being protected by an ESD device, was swept from zero, and the current being passed by the ESD device 40 was measured. In this device under test the base width, as designated by line 92 in FIG. 6, was held constant at 45 µm, and the collector-base separation or space 90 between the P-type base and the N-type collector was varied from 12 µm for line 120, to 13 µm for line 122, and 14 µm for line 124. This gave trigger voltages of 45, 78 and 115 volts respectively, for a transistor fabricated in accordance with a given fabrication process. Different processes, having different doping concentrations or thermal budgets give different specific results.

Figure 8:
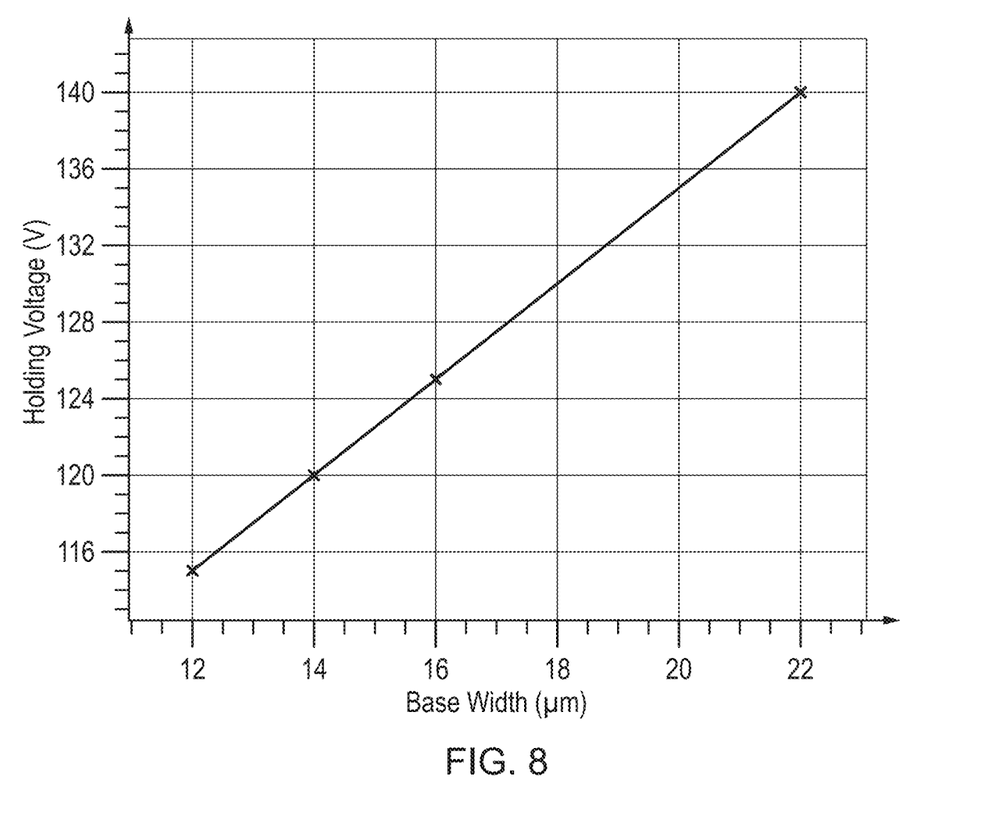
FIG. 8 is a graph showing holding voltage versus base width, according to one embodiment of this disclosure.

A similar test of holding voltage was performed for a base-to-collector spacing of 14 µm and varying the base width from 12 to 50 µm. The holding voltages are shown in FIG. 8. In general terms, the holding voltage increases by approximately 2 V for each 1 µm of base width, in a well behaved manner.

In both examples of modulation in FIG. 7 the device was designed such that changes in a mask-defined, horizontal dimension (e.g., spacing between two doped regions of a transistor or width of a doped region) caused distinct and readily measurable changes in operational thresholds (e.g., trigger voltage or holding voltage) of the ESD protection device 40 incorporating that transistor. Thus, the trigger voltage and holding voltage can be tailored for the secondary protection device 40 and its functions by the simple selection of horizontal dimensions in the doping masks.

Because the ESD protection device 40 allows mask-defined horizontal dimensions to tailor operational thresholds (e.g., trigger voltage or holding voltage), special doping dosages need not be used for this purpose. Instead, a designer may select doping dosages in order to optimize the performance of other transistors to be simultaneously fabricated on the substrate for the same integrated circuit. In some embodiments, at least one ESD protection device 40 is fabricated on the substrate simultaneously with at least one "primary task" device, by which is meant a non-protective transistor employed in the primary functions of the integrated circuit. During a doping step of the fabrication process, a single mask may be used to simultaneously define at least one doped region or active area of both an ESD device and a primary task device. Thus, one or more doped regions of the primary device may share the same dopant dosage and thus about the same maximum dopant levels with one or more doped regions of ESD protection device.

In one embodiment, the primary device is a MOSFET transistor, such as the transistor 20 of FIG. 2 that is to be protected by the ESD protection device. The source and drain regions of such a MOSFET can be simultaneously doped, using the same mask, as one of the regions of the ESD protection device. For example, the source and drain regions of a MOSFET and the base; or the collector and emitter regions of a secondary (ESD/EFT) protection device may be simultaneously doped $P^+$, or may be simultaneously doped $N^+$, by a single mask. In another embodiment, the emitter region of a primary task bipolar transistor and the emitter region of a secondary protection device may be simultaneously doped $N^+$, or may be simultaneously doped $P^+$, by a single mask. Similarly, each of the secondary protection device base and collector regions can be simultaneously doped with base and collector regions, respectively, of other non-protective bipolar transistors on the substrate.

In each of the foregoing examples, one or more active regions of a primary task transistor and the secondary protection device transistor share a common dopant dosage and thus about the same maximum dopant level, which may be selected in order to optimize performance of the primary transistor. At the same time, performance of the secondary protection device may be adjusted by selecting a mask-defined horizontal dimension. The ability to tailor the secondary protection device's operational threshold voltages such as trigger voltage and holding voltage through selection of horizontal dimensions in the doping masks allows doping dosages to be optimized for other transistors that are simultaneously fabricated, while still minimizing masking steps by simultaneous doping of both types of transistors.

According to one embodiment, the secondary protection device is connected such that the collector 270 is connected to the terminal 18 of the integrated circuit 5 that is to be protected, and the emitter is connected to the ground supply rail. The base terminal can be left floating or can be connected to the emitter via a resistor. Where a resistor is provided, the voltage difference across the resistor that arises when current flow in the base region has been initiated by impact ionization can be used to further control the "snap back" characteristic of the secondary protection device.

The arrangement described hitherto is suitable for providing unidirectional ESD protection. However, ESD events may occur with either polarity, and hence the integrated circuit benefits from protection against input terminal voltages that are either excessively above its positive supply rail, or excessively below its negative supply rail. In order to achieve this bi-directional ESD protection, two devices can be provided in series. Further reference should be made to US2011-0101444 for additional teachings.

Embodiments have been described in the context of NPN devices. PNP structures can also be formed by reversing the dopant conductivity types in the examples provided above. However, carrier mobility is lower in PNP transistors, so they may provide a slower response.

It is thus possible to provide ESD (and EFT) protection devices where the characteristics are easily controlled by parameters at a surface (at least during device manufacture) of the device, or by control of horizontal dimensions of doped features. These features, and thus ESD protection device operational thresholds, are readily controlled by mask design.

Thus the ESD protection device can be provided on the same wafer as the functional circuit and can have its threshold and snap back voltages adjusted to interact with the threshold and snap back voltages of the surge protector.

Figure 9:
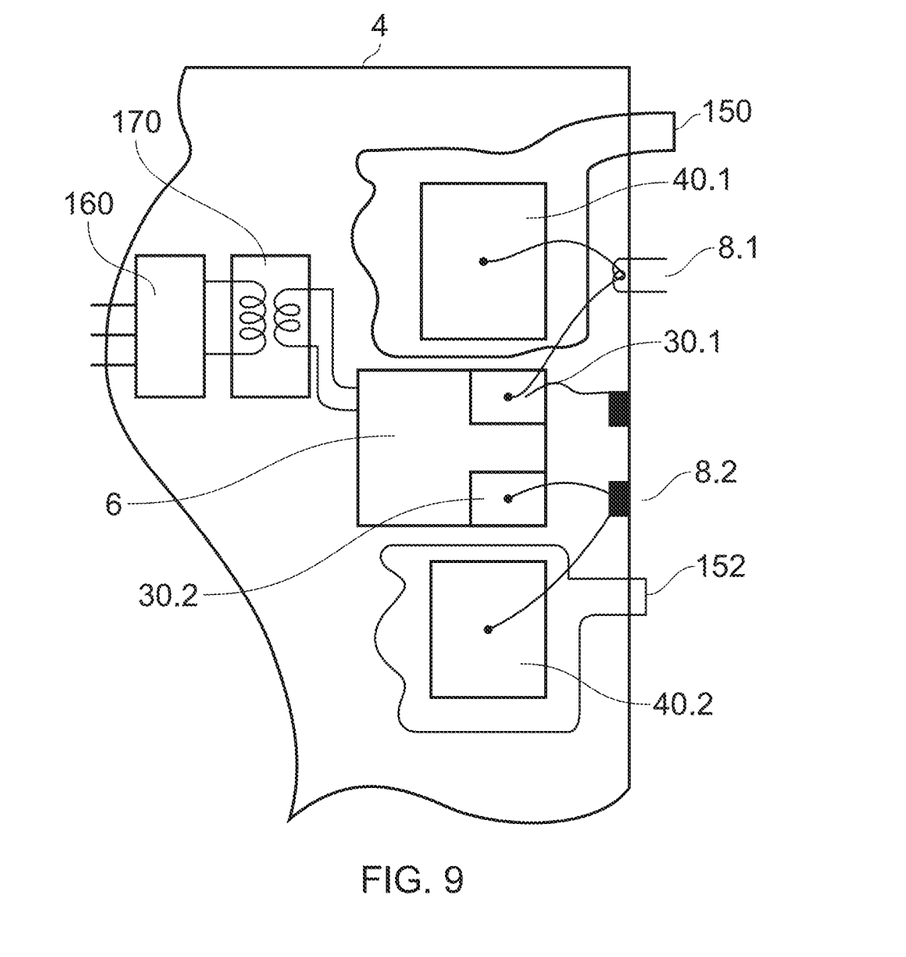
FIG. 9 is a representation of an integrated circuit according to one embodiment of the disclosure.

FIG. 9 is a schematic diagram of an integrated circuit constituting an embodiment of the present disclosure. The integrated circuit package 4 contains a plurality of dies. A functional circuit 6, such as a processor with an interface such as an input stage and a bus driver (for example for connection to a CAN bus) are provided on a first die 2. The first die may also have several ESD protection cells, of which the cells 30.1 and 30.2 represent examples, fabricated on the die 2 and connected to respective terminals 8.1 and 8.2 formed as part of a lead frame within the integrated circuit package 4. Second and third dies, each carrying a primary protection device, e.g. a surge protector 40.1 and 40.2 are also carried on the lead frame and are connected between a shared ground/Negative rail pin 150 (or respective ground/negative rail pins 150 and 152) and respective ones of the input/output pins 8.1 and 8.2.

The surge protectors 40.1 and 40.2 may be attached to their lead frames by silver contacts to reduce resistance and prevent oxidation.

The integrated circuit package 4 may include other components and subsystems such as a second functional circuit 160 which may be fabricated on its own die and galvanically isolated from the first functional circuit but exchanging data and/or power with the first functional circuit by way of an isolator such as a micro-transformer 170 which may be formed on a further die or be split between the first and second dies.

Figure 10:
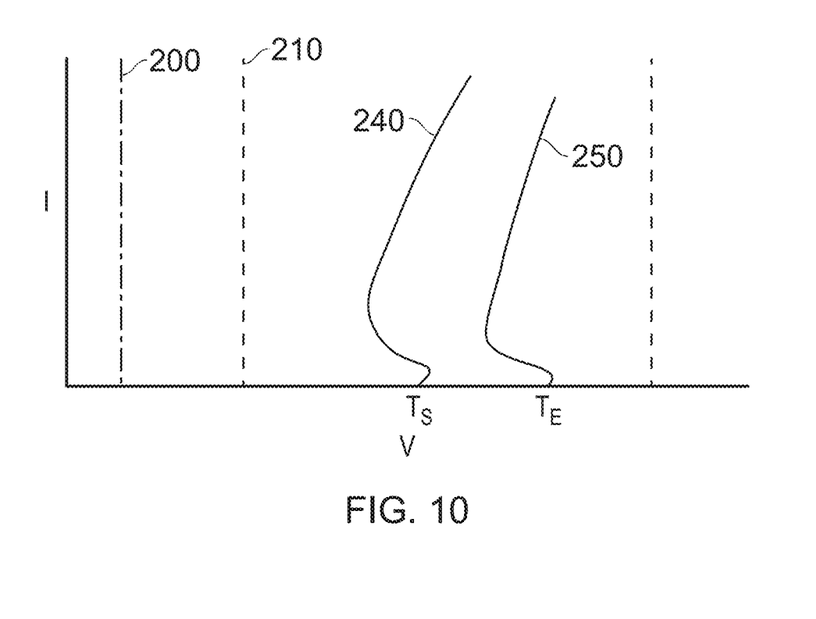
FIG. 10 is a graph showing the placement of the threshold voltages and snap back voltages in an example of an operating characteristic for an integrated circuit constituting an embodiment of the present disclosure.

FIG. 10 schematically shows the trigger and snap back voltages of the ESD protection device 30 and the surge protection device 40 in the context of voltages that might be experienced by an integrated circuit. Chain-dot line 200 represents the supply voltage to the circuit, which in this example may be 3.3V. Chain line 210 represents a minimum voltage where it must be guaranteed that the protection devices will not trigger. In some embodiments this is 42 Volts but could typically be between 35 and 50V. Line 220 represents a maximum voltage that the circuit can be exposed to without damage which in the example embodiments is around 125V. The surge limiter 40 is set to trigger at a voltage $T_S$ and then to follow a snap back curve represented by line 240. The trigger voltage for the surge limiter in this example is set between 60 and 75V and may be set to within 0.1 V of a target voltage. The line 240 may drop beneath the voltage limit of line 210 (which may be around 42 Volts in one possible embodiment of this disclosure), but it must not drop beneath the supply rail voltage of line 200 otherwise the protection devices will never recover after being triggered without a power down sequence being performed. The ESD device 30 triggers at a trigger voltage $T_E$ (typically around 95 to 110V) which is greater than $T_S$ but less than the maximum permissible voltage defined by line 220. The ESD protection device has its own snap back curve indicated by line 250 and snapping back to between 80 and 90V. By appropriate setting of the device sizes (and hence on resistance), snap back performance and trigger voltage, the performance of both the Surge protector and ESD protector can be adjusted to fit both functions within the operating voltage constraints of the integrated circuit and to get the devices to work in cooperation, whilst relieving the user or board designer form the task of providing their own over-voltage protection components.

Electrostatic and surge protection devices as described herein can be implemented in various apparatuses. Examples of the electronic devices incorporating such ESD and surge protection devices can include high speed signal processing chips, power regulators, memory chips, memory modules, circuits of optical networks or other communication networks, and disk driver circuits. Products in which such electronics can be incorporated include, but are not limited to, consumer electronic products, parts of the consumer electronic products, electronic test equipment, etc. The consumer electronic products can include, but are not limited to, a mobile phone, cellular base stations, a telephone, a television, a computer monitor, a computer, a hand-held computer, a personal digital assistant (PDA), a microwave, a refrigerator, a stereo system, a DVD player, a CD player, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic device can include unfinished products.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

Although the claims have been presented in single dependency format suitable for filing at the USPTO it is to be understood that any claim may be multiply dependent of any proceeding claim of the same type unless that is clearly technically infeasible.

The invention claimed is:

1. An integrated circuit package, containing:
   a first semiconductor die carrying a functional circuit configured to interact with a device outside of the integrated circuit package by way of a connection node;
   a first electrical over-voltage protection device configured to protect against a first type of electrical over-voltage event when triggered by the first type of electrical over-voltage event;
   a second electrical over-voltage protection device configured to protect against a second type of electrical over-voltage event different from the first type when triggered by the second type of electrical over-voltage event,
wherein the second electrical over-voltage protection device is configured not to trigger in response to the first type of electrical over-voltage event;
wherein the second electrical over-voltage protection device and the first electrical over-voltage protection device are each electrically coupled to both the connection node and the functional circuit.

2. An integrated circuit package as claimed in claim 1, in which the first electrical over-voltage protection device is formed on a second semiconductor die and is a surge protector.

3. An integrated circuit package as claimed in claim 1, in which the first electrical over-voltage protection device is formed in an isolated region of the first semiconductor die and is a surge protector.

4. An integrated circuit package as claimed in claim 1, in which the second electrical over-voltage protection device is formed on the first semiconductor die.

5. An integrated circuit package as claimed in claim 1, in which the second electrical over-voltage protection device comprises a bipolar transistor based over voltage protection device.

6. An integrated circuit package as claimed in claim 1, in which the first electrical over-voltage protection device comprises a silicon controlled rectifier.

7. An integrated circuit package as claimed in claim 1, in which the first and second electrical over-voltage protection devices are in a high impedance state until a voltage across one of the first and second electrical over-voltage protection devices exceeds a trigger voltage, and the one of the first and second electrical over-voltage protection devices returns to the high impedance state once the current through it drops below a holding current threshold.

8. An integrated circuit package as claimed in claim 1, wherein at least one of the first and second electrical over-voltage protection devices is configured to protect against ESD events.

9. An integrated circuit package as claimed in claim 1, wherein the functional circuit is a first functional circuit, the integrated circuit package further including a second functional circuit on a second die, and where the first functional circuit and second functional circuit exchange signals with each other by way of an isolator.

10. The integrated circuit package of claim 1, wherein the first and second electrical over-voltage protection devices are coupled to one another without a resistor between them.

11. The integrated circuit package of claim 8, wherein the at least one of the first and second electrical over-voltage protection devices configured to protect against ESD events is further configured to protect against ESD events both above a positive supply rail voltage and below a negative supply rail voltage of the at least one of the first and second electrical over-voltage protection devices.

12. An integrated circuit package containing:
a first semiconductor die carrying a functional circuit configured to interact with a device outside of the integrated circuit package by way of a connection node;
a surge protector configured to protect against surge events; and
an electrostatic discharge (ESD) protector,
wherein the ESD protector is configured not to trigger in response to surge events.

13. An integrated circuit package as claimed in claim 12 in which the surge protector is formed on a second semiconductor die.

14. An integrated circuit package as claimed in claim 12, in which the surge protector is formed in an isolated region of the first semiconductor die.

15. An integrated circuit package as claimed in claim 12, in which the ESD protector is formed on the first semiconductor die.

16. An integrated circuit package as claimed in claim 12, in which the ESD protector is in a high impedance state until a voltage across the ESD protector exceeds a trigger voltage, and the ESD protector returns to the high impedance state once a current through the ESD protector drops below a holding current threshold.

17. An integrated circuit package as claimed in claim 12, in which the surge protector is connected to an input or an output of the functional circuit on the first semiconductor die.

18. An integrated circuit package as claimed in claim 12, wherein the functional circuit is a first functional circuit, the integrated circuit package further including a second functional circuit on a second die, and where the first functional circuit and second functional circuit exchange signals with each other by way of an isolator.

19. An integrated circuit package as claimed in claim 18, wherein the isolator is a micro transformer.

20. A method of protecting an integrated circuit package containing a first semiconductor die carrying a functional circuit configured to interact with a device outside of the integrated circuit package by way of a connection node, the method comprising:
providing a surge protector, configured to protect against surge events, and an electrostatic discharge (ESD) protector within the integrated circuit package, wherein the ESD protector is configured not to trigger in response to surge events.

* * * * *